US011532513B2

(12) United States Patent
Jin

(10) Patent No.: US 11,532,513 B2
(45) Date of Patent: Dec. 20, 2022

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Jisong Jin, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 65 days.

(21) Appl. No.: 17/035,067

(22) Filed: Sep. 28, 2020

(65) Prior Publication Data
US 2021/0183700 A1 Jun. 17, 2021

(30) Foreign Application Priority Data
Dec. 17, 2019 (CN) .......................... 201911302205.4

(51) Int. Cl.
*H01L 21/768* (2006.01)
*H01L 23/522* (2006.01)
*H01L 27/11* (2006.01)

(52) U.S. Cl.
CPC .. *H01L 21/76885* (2013.01); *H01L 21/76816* (2013.01); *H01L 23/5226* (2013.01); *H01L 27/1104* (2013.01); *H01L 21/76877* (2013.01)

(58) Field of Classification Search
CPC ......... H01L 21/76885; H01L 21/76816; H01L 23/5226; H01L 27/1104; H01L 21/76877; H01L 23/48; H01L 21/4846; H01L 23/535
See application file for complete search history.

(56) References Cited

U.S. PATENT DOCUMENTS

| 2020/0058585 A1* | 2/2020 | Xu ..................... H01L 21/76816 |
| 2020/0161236 A1* | 5/2020 | Kim .................... H01L 27/2481 |
| 2020/0328116 A1* | 10/2020 | Zhu ................... H01L 29/78603 |
| 2020/0328311 A1* | 10/2020 | Verma ................. H01L 29/0649 |

* cited by examiner

*Primary Examiner* — Karen Kusumakar
(74) *Attorney, Agent, or Firm* — Anova Law Group, PLLC

(57) ABSTRACT

A method for forming a semiconductor structure includes providing a substrate, including a first region and a second region adjacent to the first region; forming a first dielectric layer on the substrate in the first region and the second region; and forming a plurality of first plug structures in the first dielectric layer. The top surface of each first plug structure is exposed by the first dielectric layer. The method further includes forming a first conductive layer on the first dielectric layer of the second region; forming a second dielectric layer on the first dielectric layer of the first region and on the first conductive layer of the second region; and forming a plurality of second plug structures in the second dielectric layer of the first region. The bottom surface of each second plug structure is in contact with the top surface of a first plug structure.

17 Claims, 8 Drawing Sheets

SEMICONDUCTOR STRUCTURE AND FABRICATION METHOD THEREOF

CROSS-REFERENCE TO RELATED APPLICATIONS

This application claims the priority of Chinese Patent Application No. CN201911302205.4, filed on Dec. 17, 2019, the entire content of which is incorporated herein by reference.

FIELD OF THE DISCLOSURE

The present disclosure generally relates to the field of semiconductor manufacturing and, more particularly, relates to semiconductor structures and fabrication methods thereof.

BACKGROUND

With the continuous development of the very-large-scale integration (VLSI) process technology, feature size of semiconductor devices continues to shrink, and the performance of semiconductor devices becomes more advanced. The integration of integrated circuit (IC) chips has reached hundreds of millions or even billions of devices on a single chip, and multi-layer interconnection has become widely used in IC chips.

Conventional interconnect structures are usually made of aluminum. As the size of semiconductor devices continuously decreases, interconnect structure becomes smaller and smaller, and accordingly, the current density passing through the interconnect structure becomes higher and higher. In addition, the response speed of interconnect structures also needs to be shorter. The existing aluminum interconnect structures are no longer meet the requirements. Therefore, copper has replaced aluminum as the material of interconnect structures. Compared with aluminum, copper has a lower resistivity and more desirable electromigration resistance. Therefore, interconnect structure made of copper can reduce the resistance capacitance (RC) delay of the interconnect structure, and improve device reliability. As such, replacing aluminum with copper has become a development trend.

However, the production cost of an interconnection structure formed by existing method is high. There is an urgent need to provide an interconnection structure and a fabrication method to reduce the production cost while ensuring the electrical performance of the interconnection structure. The disclosed semiconductor structures and fabrication methods are directed to solve one or more problems set forth above and other problems in the art.

BRIEF SUMMARY OF THE DISCLOSURE

One aspect of the present disclosure provides a method for forming a semiconductor structure. The method includes providing a substrate, including a first region and a second region adjacent to the first region; forming a first dielectric layer on the substrate in the first region and the second region; and forming a plurality of first plug structures in the first dielectric layer. The top surface of each first plug structure of the plurality of first plug structures is exposed by the first dielectric layer. The method further includes forming a first conductive layer on the first dielectric layer of the second region; forming a second dielectric layer on the first dielectric layer of the first region and on the first conductive layer of the second region; and forming a plurality of second plug structures in the second dielectric layer of the first region. The bottom surface of each second plug structure of the plurality of second plug structures is in contact with the top surface of a first plug structure.

Optionally, the method further includes forming a gate conductive layer and a plurality of source/drain conductive layers in the first dielectric layer. The plurality of first plug structures is located on the gate conductive layer, the plurality of source/drain conductive layers, or both the gate conductive layer and the plurality of source/drain conductive layers.

Optionally, the method further includes forming a first pull-up gate structure, a first pull-down gate structure, and a first transmission gate structure in the first dielectric layer; forming a first source region and a first drain region in the substrate respectively on the two sides of the first pull-up gate structure; forming a second source region and a second drain region in the substrate respectively on two sides of the first pull-down gate structure; and forming a third source region and a third drain region in the substrate respectively on two sides of the first transmission gate structure. The gate conductive layer is located on a top surface of the first transmission gate structure, and the power conductive layer is electrically connected to the first drain region through a first plug structure and a source/drain conductive layer.

Optionally, forming the first dielectric layer and the plurality of first plug structures includes forming an initial first dielectric layer on the substrate in the first region and the second region; and forming a first mask layer on the initial first dielectric layer. A plurality of first openings is formed in the first mask layer to expose a portion of the initial first dielectric layer. Forming the first dielectric layer and the plurality of first plug structures further includes etching the initial first dielectric layer using the first mask layer as an etch mask to form the first dielectric layer, the first dielectric layer including a plurality of first dielectric openings; and forming the plurality of first plug structures in the plurality of first dielectric openings.

Optionally, when forming the plurality of second plug structures, the method further includes forming a third plug structure in the second dielectric layer of the second region. The bottom surface of the third plug structure is in contact with the top surface of the first conductive layer.

Optionally, forming the second dielectric layer, the plurality of second plug structures, and the third plug structure includes forming an initial second dielectric layer on the first dielectric layer of the first region and on the first conductive layer of the second region; forming a second mask layer, including a plurality of second openings and a third opening that expose the initial second dielectric layer; etching the initial second dielectric layer using the second mask layer as an etch mask until exposing top surfaces of the plurality of first plug structures and a top surface of the first conductive layer to form the second dielectric layer, a plurality of second dielectric openings and a third dielectric opening being formed in the second dielectric layer with positions corresponding positions of the plurality of second openings and the third opening, respectively; and forming the plurality of second plug structures in the plurality of second dielectric openings and forming the third plug structure in the third dielectric opening.

Optionally, etching the initial second dielectric layer includes a dry etching process, a wet etching process, or a combination thereof.

Optionally, the width of each second dielectric opening of the plurality of second dielectric openings is in a range of approximately 10 nm to 100 nm.

Optionally, after forming the second dielectric layer, the method further includes forming a second conductive layer on the second dielectric layer. The second conductive layer is located in the first region and the second region; and the top surface of the plurality of second plug structures and the top surface of the third plug structure are electrically connected to the bottom surface of the second conductive layer, respectively.

Optionally, the substrate is made of germanium (Ge), silicon germanium (SiGe), silicon carbide (SiC), gallium arsenic (GaAs), or indium arsenic (InAs).

Optionally, the plurality of source/drain conductive layers and the gate conductive layer are made of a metal, including copper (Cu), cobalt (Co), tungsten (W), aluminum (Al), titanium (Ti), titanium nitride ($TiN_x$), tantalum (Ta), tantalum nitride ($TaN_x$), ruthenium (Ru), or a combination thereof.

Optionally, the plurality of first plug structures is made of a metal, including copper (Cu), cobalt (Co), tungsten (W), aluminum (Al), titanium (Ti), titanium nitride ($TiN_x$), tantalum (Ta), tantalum nitride ($TaN_x$), ruthenium (Ru), or a combination thereof.

Optionally, the first dielectric layer is made of silicon oxide ($SiO_x$), a low-K dielectric material, or an ultra-low-K dielectric material.

Optionally, the second dielectric layer is made of silicon oxide ($SiO_x$), a low-K dielectric material, or an ultra-low-K dielectric material.

Optionally, the plurality of second plug structures is made of a metal, including ruthenium (Ru), copper (Cu), cobalt (Co), tungsten (W), aluminum (Al), tantalum (Ta), tantalum nitride ($TaN_x$), titanium (Ti), titanium nitride ($TiN_x$), silver (Ag), platinum (Pt), or a combination thereof.

Optionally, the third plug structure is made of a metal, including ruthenium (Ru), copper (Cu), cobalt (Co), tungsten (W), aluminum (Al), tantalum (Ta), tantalum nitride ($TaN_x$), titanium (Ti), titanium nitride ($TiN_x$), silver (Ag), platinum (Pt), or a combination thereof.

Another aspect of the present disclosure provides a semiconductor structure. The semiconductor structure includes a substrate, including a first region and a second region adjacent to the first region; a first dielectric layer, formed on the substrate in the first region and the second region; and a plurality of first plug structures, formed in the first dielectric layer. The top surface of each first plug structure of the plurality of first plug structures is exposed by the first dielectric layer. The semiconductor structure further includes a first conductive layer, formed on the first dielectric layer of the second region; a second dielectric layer, formed on the first dielectric layer of the first region and on the first conductive layer of second region; and a plurality of second plug structures, formed in the second dielectric layer of the first region. The bottom surface of each second plug structure of the plurality of second plug structures is in contact with the top surface of a first plug structure.

Optionally, the semiconductor structure further includes a third plug structure, formed in the second dielectric layer of the second region. The bottom surface of the third plug structure is in contact with the top surface of the first conductive layer.

Optionally, the semiconductor structure further includes a gate conductive layer and a plurality of source/drain conductive layers, formed in the first dielectric layer. The plurality of first plug structures is located on the gate conductive layer, the plurality of source/drain conductive layers, or both the gate conductive layer and the plurality of source/drain conductive layers.

Compared to existing semiconductor structures and fabrication methods, the disclosed semiconductor structures and fabrication methods may demonstrate the following exemplary advantages.

According to the disclosed methods, in the first region, the bottom surface of the second plug structure is directly in contact with the top surface of the first plug structure. By directly connecting the first plug structure and the second plug structure, the step of forming the word-line conductive layer WL and the power conductive layer Vss is saved. As such, while satisfying the requirements of the electrical structure, the production efficiency can be effectively improved and the production cost can also be reduced.

Further, according to the disclosed fabrication methods and semiconductor structures, the width of the second dielectric opening is in a range of approximately 10 nm to 100 nm. Because the process of forming the word-line conductive layer WL and the power conductive layer Vss is saved in the disclosed method, the second plug structure is formed directly in contact with a corresponding first plug structure. Therefore, the length of the second plug structure needs to be increased accordingly. As such, during the fabrication process, the depth of the corresponding second dielectric opening also needs to be increased. However, because the second dielectric opening formed by an etching process is generally in an inverted cone shape, in order to ensure that the bottom of the formed second dielectric opening can expose the top surface of the first plug structure, the width at the top of the second dielectric opening needs to be increased accordingly.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the present disclosure, which are illustrated in the accompanying drawings. Wherever possible, the same reference numbers will be used throughout the drawings to refer to the same or like parts.

Figure 1:
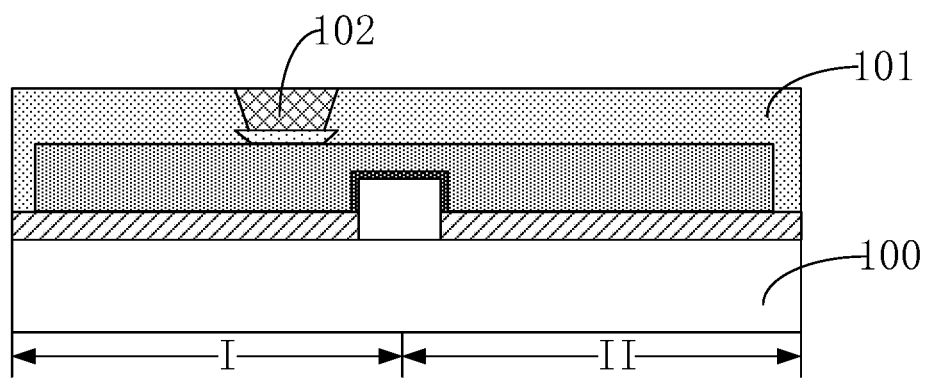
FIGS. 1-2 illustrate schematic cross-sectional views of structures at certain stages of a fabrication process of a semiconductor structure.
Figure 2:
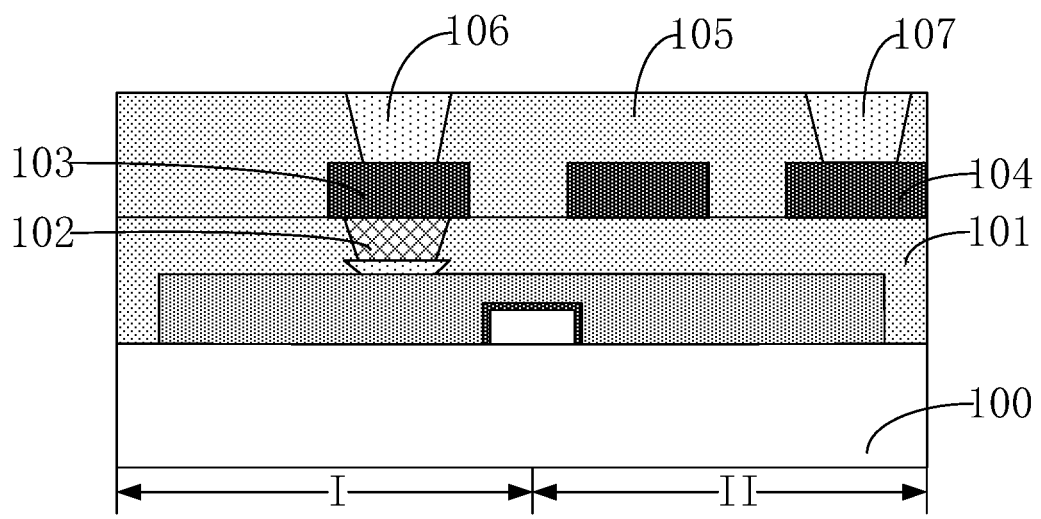

FIGS. 1-2 illustrate schematic cross-sectional views of structures at certain stages of a fabrication process of a semiconductor structure.

Referring to FIG. 1, a substrate 100 is provided. The substrate 100 includes a first region I and a second region II that are adjacent to each other. A first dielectric layer 101 is formed on the substrate 100. The first dielectric layer 101 is located on both the first region I and the second region II. A plurality of first plug structures 102 is formed in the first dielectric layer 101, and the first dielectric layer 101 exposes the top surface of each first plug structure 102. For illustrative purposes, only one first plug structure 102 is shown in FIG. 1.

Referring to FIG. 2, a first conductive layer 103 and a second conductive layer 104 are formed on the first dielectric layer 101. The first conductive layer 103 is located in the first region I, and includes a word-line conductive layer WL and a power conductive layer Vss (not shown). The bottom surface of the first conductive layer 103 is in contact with the top surface of the first plug structure 102. The second conductive layer 104 is located in the second region II, and includes a bit-line conductive layer BL and a power conductive layer Vcc. A second dielectric layer 105 is formed on the first conductive layer 103 and the second conductive layer 104. The second dielectric layer 105 is located in both the first region I and the second region II. A second plug structure 106 and a third plug structure 107 are formed in the second dielectric layer 105. The second plug structure 106 is located in the first region I and the third plug structure 107 is located in the second region II. The bottom surface of the second plug structure 106 is in contact with the top surface of the first conductive layer 103, and the bottom surface of the third plug structure 107 is in contact with the top surface of the second conductive layer 104.

According to the semiconductor structure and fabrication method described above, by sequentially connecting the first plug structure 102, the first conductive layer 103, and the second plug structure 106, the requirements of electrical design are realized. However, as a transition layer, the word-line conductive layer WL and the power conductive layer Vss will increase the process steps. In addition, in electrical design, it is also necessary to ensure electrical separation between the word-line conductive layer WL and the power conductive layer Vss. Therefore, a metal cutting process is required to separate the two layers, and thus besides the increase in the fabrication steps, the manufacturing cost may also increase.

The present disclosure provides a semiconductor structure and a fabrication method. By directly connecting the first plug structure and the second plug structure, the step of forming the word-line conductive layer WL and the power conductive layer Vss is saved. As such, while satisfying the requirements of the electrical structure, the production efficiency can be effectively improved and the production cost can also be reduced.

To make the aforementioned objectives, features, and beneficial effects of the present disclosure more comprehensible, specific embodiments of the present disclosure are described in detail with reference to the accompanying drawings.

Figure 10:
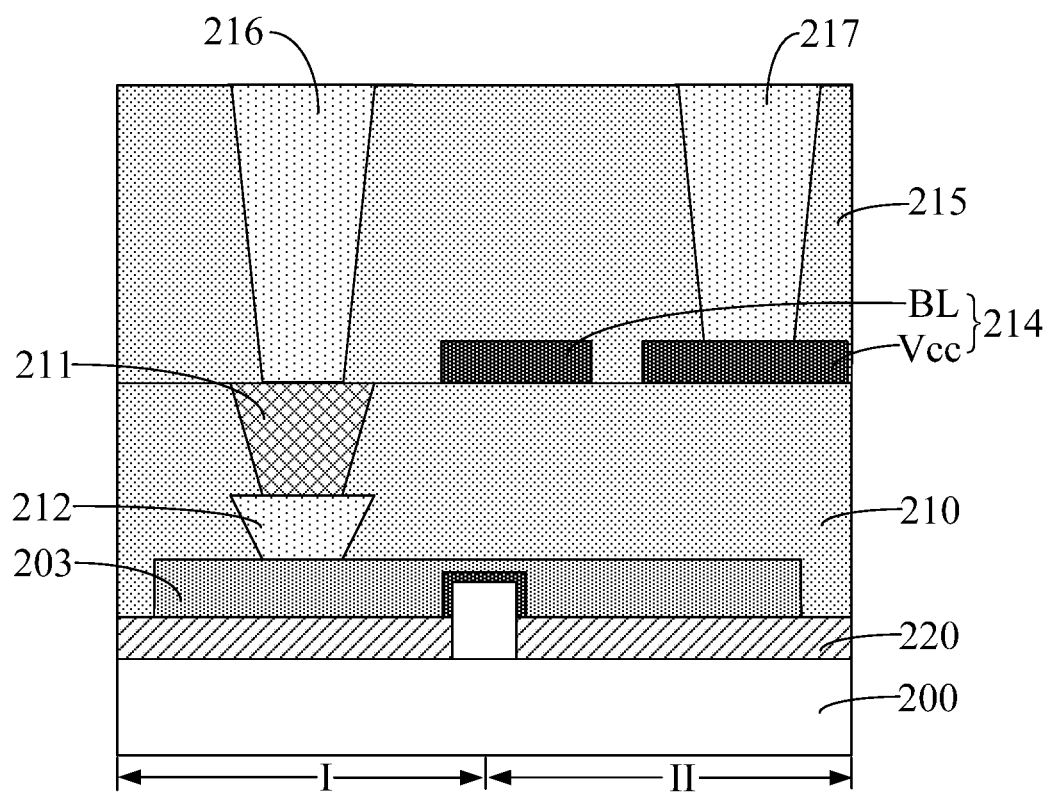
Figure 11:
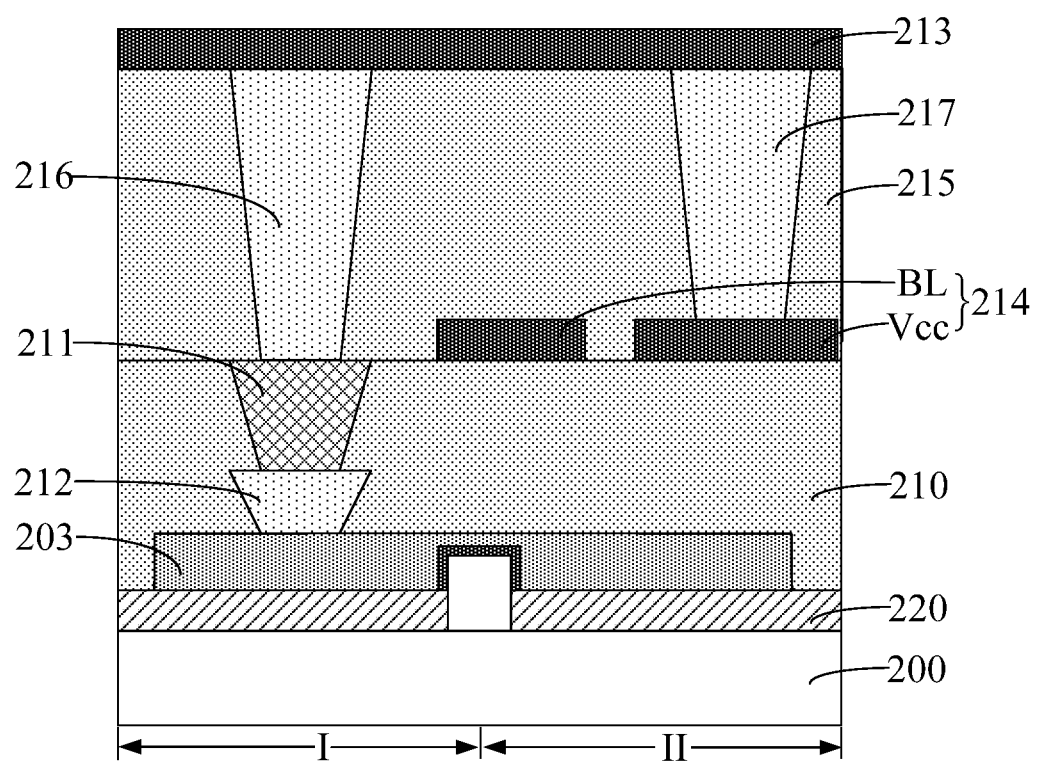
Figure 12:
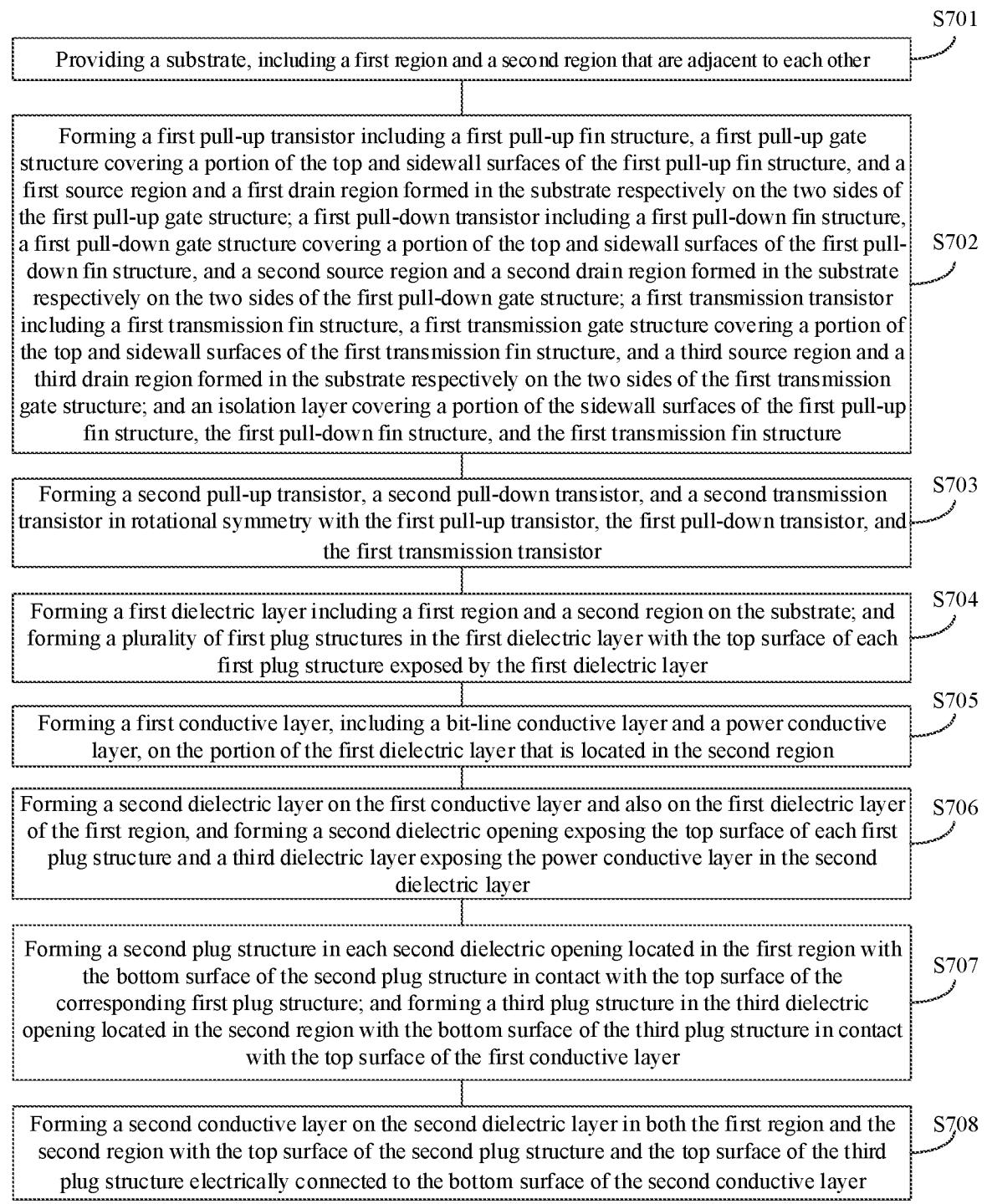
FIG. 12 illustrates a flowchart of an exemplary method for fabricating a semiconductor structure consistent with some embodiments of the present disclosure.

The present disclosure provides a method for forming a semiconductor structure. FIG. 12 illustrates a flowchart of an exemplary method for forming a semiconductor structure according to some embodiments of the present disclosure, and FIGS. 3-11 illustrate schematic cross-sectional views of structures at certain stages of the exemplary method.

Figure 3:
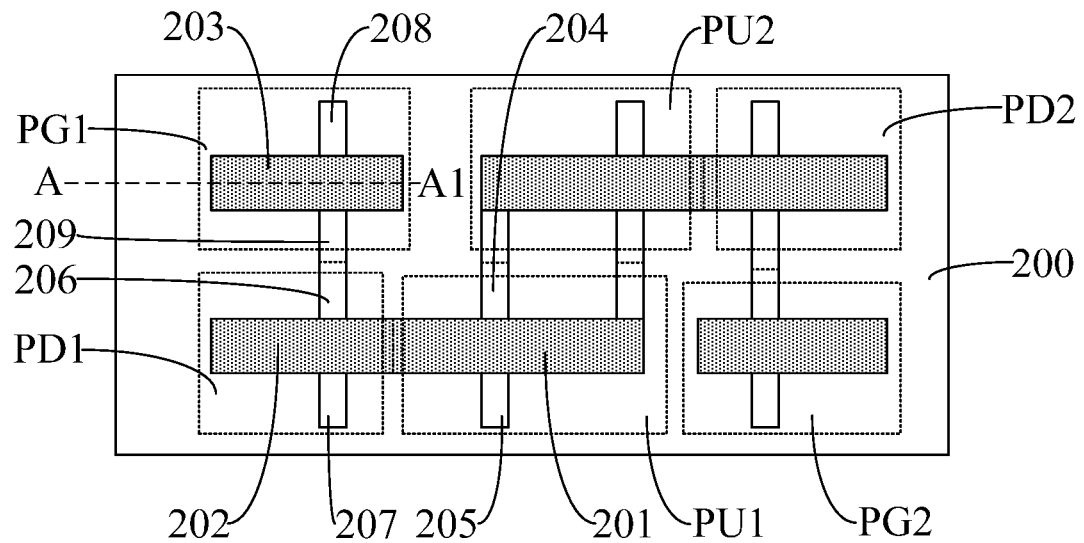
FIGS. 3-11 illustrate schematic views of structures at certain stages of an exemplary method for fabricating a semiconductor structure consistent with some embodiments of the present disclosure.
Figure 4:
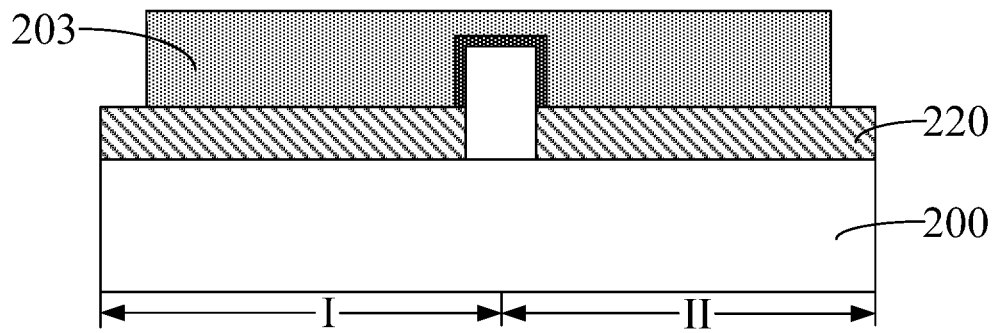

Referring to FIG. 12, a substrate including a first region and a second region may be provided (S701). FIGS. 3-4 illustrate schematic views of a semiconductor structure consistent with various embodiments of the present disclosure. Specifically, FIG. 4 illustrates a schematic cross-sectional view of the semiconductor structure shown in FIG. 3 along an A-A1 direction.

Referring to FIGS. 3-4, a substrate 200 may be provided, and the substrate 200 may include a first region I and a second region II that are adjacent to each other. In one embodiment, the substrate 200 may be made of silicon. In other embodiments, the substrate 200 may be made of germanium (Ge), silicon germanium (SiGe), silicon carbide (SiC), gallium arsenic (GaAs), indium arsenic (InAs), or any other appropriate semiconductor material or composite.

Further, returning to FIG. 12, a first pull-up transistor including a first pull-up fin structure, a first pull-up gate structure covering a portion of the top and sidewall surfaces of the first pull-up fin structure, and a first source region and a first drain region formed in the substrate respectively on the two sides of the first pull-up gate structure; a first pull-down transistor including a first pull-down fin structure, a first pull-down gate structure covering a portion of the top and sidewall surfaces of the first pull-down fin structure, and a second source region and a second drain region formed in the substrate respectively on the two sides of the first pull-down gate structure; a first transmission transistor including a first transmission fin structure, a first transmission gate structure covering a portion of the top and sidewall surfaces of the first transmission fin structure, and a third source region and a third drain region formed in the substrate respectively on the two sides of the first transmission gate structure; and an isolation layer covering a portion of the sidewall surfaces of the first pull-up fin structure, the first pull-down fin structure, and the first transmission fin structure may be formed (S702). The exemplary semiconductor structure shown in FIGS. 3-4 includes a first pull-up transistor, a first pull-down transistor, and a first transmission transistor.

Referring to FIGS. 3-4, a first pull-up fin structure (not labeled), a first pull-down fin structure (not labeled), and a first transmission fin structure (not labeled) may be formed on the substrate 200. Also, an isolation layer 220 may be formed on the substrate 200. The top surface of the isolation layer 220 may be lower than the top surfaces of the first pull-up fin structure, the first pull-down fin structure, and the first transmission fin structure. Thus, the isolation layer 220 may cover a portion of the sidewall surfaces of the first pull-up fin structure, the first pull-down fin structure, and the first transmission fin structure. A first pull-up gate structure 201, a first pull-down gate structure 202, and a first transmission gate structure 203 may be formed on the substrate 200. The first pull-up gate structure 201 may cover a portion of the top and sidewall surfaces of the first pull-up fin structure, the first pull-down gate structure 202 may cover a portion of the top and sidewall surfaces of the first pull-down fin structure, and the first transmission gate structure 203 may cover a portion of the top and sidewall surfaces of the first transmission fin structure. A first source region 204 and a first drain region 205 may be formed in the substrate 200 on the two sides of the first pull-up gate structure 201, respectively; a second source region 206 and a second drain region 207 may be formed in the substrate 200 on the two sides of the first pull-down gate structure 202, respectively; and a third source region 208 and a third drain region 209 may be formed in the substrate 200 on the two sides of the first transmission gate structure 203, respectively.

In one embodiment, the first pull-up gate structure 201, the first pull-down gate structure 202, and the first transmission gate structure 203 may be formed on the isolation layer 220. For example, a first pull-up transistor PU1 may be formed by the first pull-up gate structure 201, the first pull-up fin structure, the first source region 204, and the first drain region 205; a first pull-down transistor PD1 may be formed by the first pull-down gate structure 202, the first pull-down fin structure, the second source region 206, and the second drain region 207; and a first transmission transistor PG1 may be formed by the first transmission gate structure 203, the first transmission fin structure, the third source region 208, and the third drain region 209.

Further, returning to FIG. 12, a second pull-up transistor, a second pull-down transistor, and a second transmission transistor may be formed, and the second pull-up transistor, the second pull-down transistor, and the second transmission transistor may be in rotational symmetry with the first pull-up transistor, the first pull-down transistor, and the first transmission transistor (S703). The exemplary semiconductor structure shown in FIGS. 3-4 includes a second pull-up transistor, a second pull-down transistor, and a second transmission transistor.

Referring to FIGS. 3-4, a second pull-up transistor PU2, a second pull-down transistor PD2, and a second transmission transistor PG2 may be formed, and the second pull-up transistor PU2, the second pull-down transistor PD2, and the second transmission transistor PG2 may be in rotational symmetry with the first pull-up transistor PU1 the first pull-down transistor PD1, and the first transmission transistor PG1. In one embodiment, the first pull-up transistor PU1 the first pull-down transistor PD1, the first transmission transistor PG1, the second pull-up transistor PU2, the second pull-down transistor PD2, and the second transmission transistor PG2 may together form a smallest storage unit of a static memory.

Figure 5:
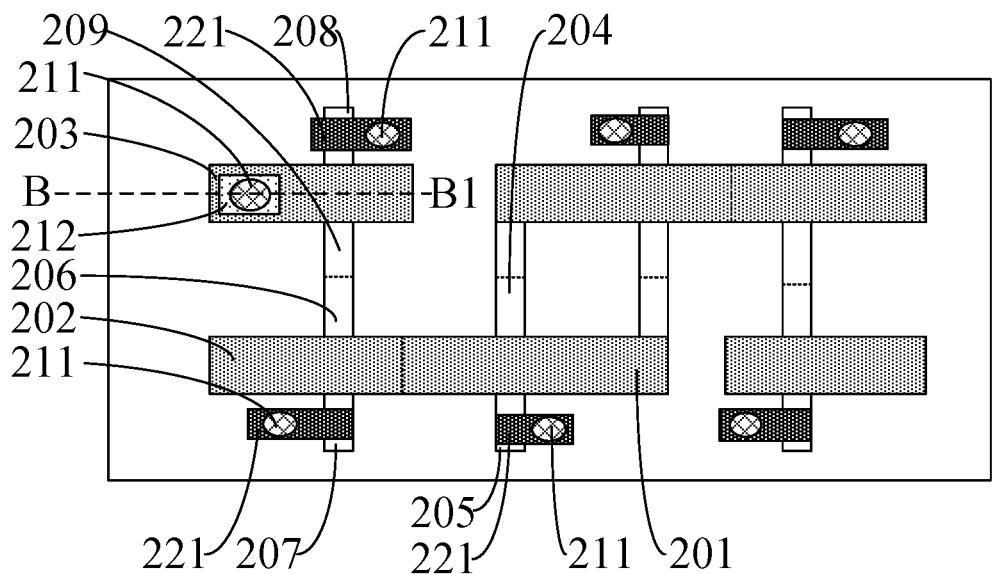
Figure 6:
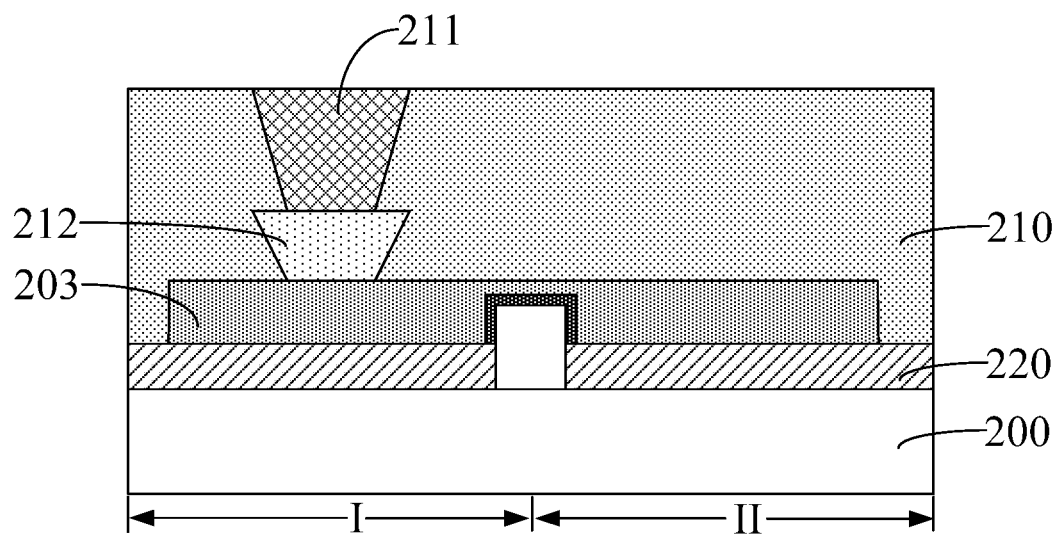

Further, returning to FIG. 12, a first dielectric layer including a first region and a second region may be formed on the substrate, a plurality of first plug structures may be formed in the first dielectric layer, and the top surface of each first plug structure may be exposed by the first dielectric layer (S704). FIGS. 5-6 illustrate schematic views of an exemplary semiconductor structure consistent with various embodiments of the present disclosure. Specifically, FIG. 6 illustrates a schematic cross-sectional view of the semiconductor structure shown in FIG. 5 along a B-B1 direction. It should be noted that for illustrative purposes, the isolation layer and the first dielectric layer are not shown in FIG. 6.

Referring to FIGS. 5-6, a first dielectric layer 210 may be formed on the substrate 200. The first dielectric layer 210 may be located in both the first region I and the second region II. A plurality of first plug structures 211 may be formed in the first dielectric layer 210, and the top surface of each first plug structure 211 may be exposed by the first dielectric layer 210. In one embodiment, the first dielectric layer 210 may be formed on the isolation layer 220.

The process of forming the first dielectric layer 210 and the plurality of first plug structures 211 may include the following exemplary steps. An initial first dielectric layer (not shown) may be formed on the substrate 200 in both the first region I and the second region II. A first mask layer (not shown) may be formed on the initial first dielectric layer. A plurality of first openings (not shown) may be formed in the first mask layer to expose a portion of the first initial first dielectric layer. Further, the initial first dielectric layer may be etched using the first mask layer as an etch mask to form the first dielectric layer 210. Corresponding to the position of each first opening, a first dielectric opening may be formed in the first dielectric layer 210. Then, a first plug structure 211 may be formed in the first dielectric opening.

In one embodiment, the first dielectric layer may be made of silicon oxide. In other embodiments, the first dielectric layer may be made of a low-K dielectric material (a material having a relative dielectric constant below 3.9) or an ultra-low-K dielectric material (a material having a relative dielectric constant below 2.5).

The plurality of first plug structures 211 may be made of a metal, and the metal may include copper (Cu), cobalt (Co), tungsten (W), aluminum (Al), titanium (Ti), titanium nitride (TiN$_x$), tantalum (Ta), tantalum nitride (TaN$_x$), ruthenium (Ru), or a combination thereof. In one embodiment, the plurality of first plug structures 211 may be made of tungsten (W).

In one embodiment, referring to FIGS. 5-6, prior to forming the plurality of first plug structures 211, the method may further include forming a gate conductive layer 212 and a plurality of source/drain conductive layers 221 in the first dielectric layer 210. The gate conductive layer 212 may be located on the top surface of the first transmission gate structure 203, and the plurality of source/drain conductive layers may respectively located on the top surfaces of the first drain region 205, the second drain region 207, and the third source region 208.

The plurality of source/drain conductive layers 221 and the gate conductive layer 212 may be made of a metal, and the metal may include copper (Cu), cobalt (Co), tungsten (W), aluminum (Al), titanium (Ti), titanium nitride (TiN$_x$), tantalum (Ta), tantalum nitride (TaN$_x$), ruthenium (Ru), or a combination thereof. In one embodiment, the gate conductive layer 212 may be made of titanium nitride (TiN$_x$), and the plurality of source/drain conductive layers 221 may be made of (TiN$_x$).

In one embodiment, the plurality of first plug structures 211 may be formed on the plurality of source/drain conductive layers 221 and on the gate conductive layer 212. In other embodiments, the plurality of first plug structures may be formed only on the gate conductive layer 212, or only on the plurality of source/drain conductive layers 221.

Figure 7:
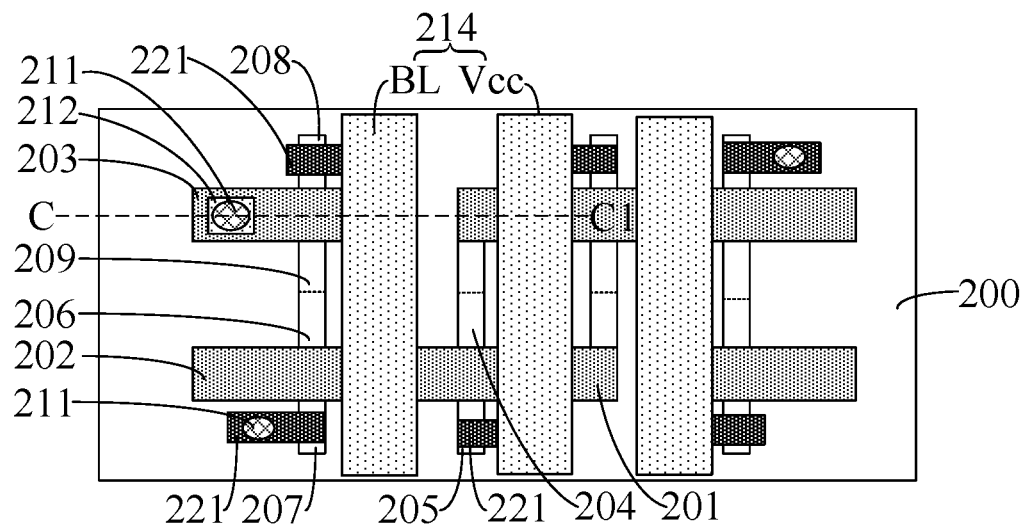
Figure 8:
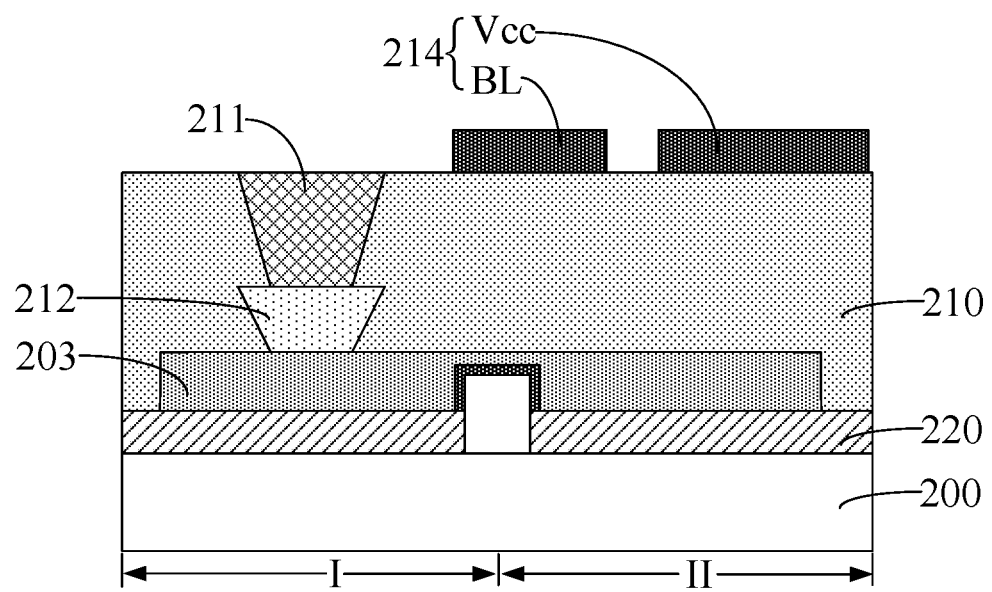

Further, returning to FIG. 12, a first conducive layer may be formed on the portion of the first dielectric layer that is located in the second region (S705). FIGS. 7-8 illustrate schematic views of an exemplary semiconductor structure consistent with various embodiments of the present disclosure. Specifically, FIG. 8 illustrates a schematic cross-sectional view of the semiconductor structure shown in FIG. 7 along a C-C1 direction.

Referring to FIGS. 7-8, a first conductive layer 214 may be formed in the second region II to cover the portion of the first dielectric layer 210 formed in the second region II.

The first conductive layer 214 may include a bit-line conductive layer BL and a power conductive layer Vcc. The bit-line conductive layer BL may be electrically connected to the third source region 208 through a first plug structure 211 and a source/drain conductive layer 221. The power conductive layer Vcc may be electrically connected to the first drain region 205 through a first plug structure 211 and a source/drain conductive layer 221.

Figure 9:
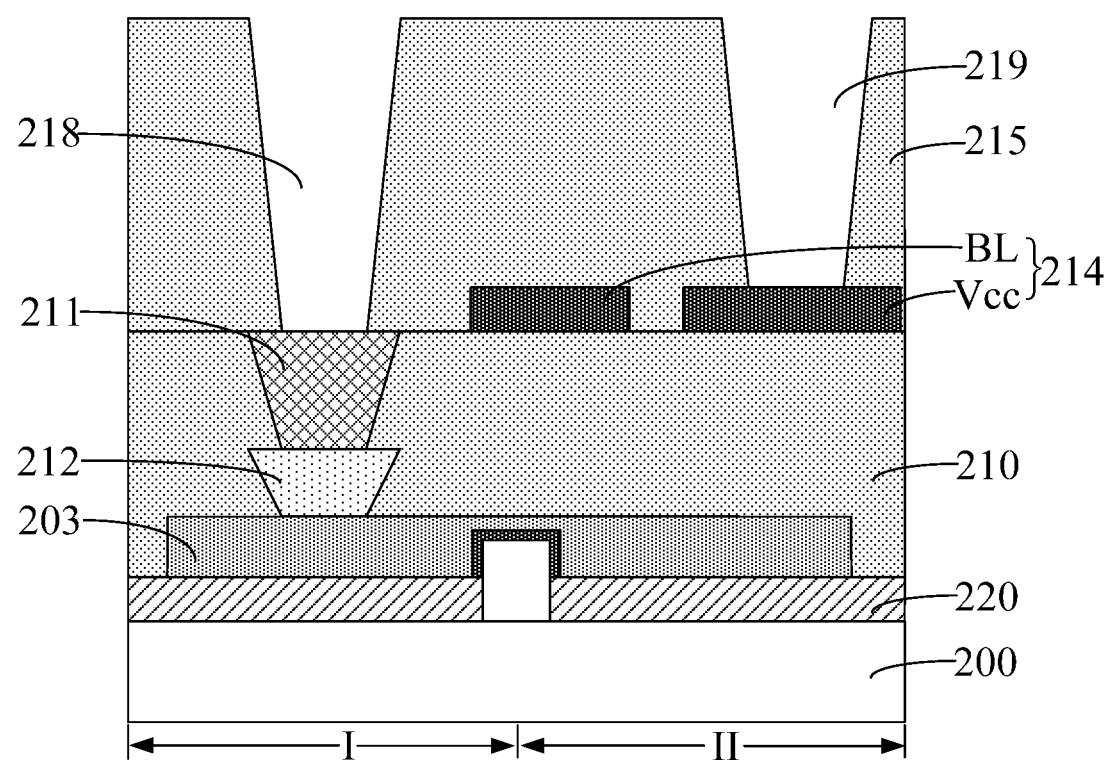

Further, returning to FIG. 12, a second dielectric layer may be formed on the first conductive layer and also on the first dielectric layer of the first region, and a second dielectric opening exposing the top surface of each first plug structure and a third dielectric layer exposing the power conductive layer may be formed in the second dielectric layer (S706). FIG. 9 illustrates a schematic cross-sectional view of a semiconductor structure consistent with various embodiments of the present disclosure. It should be noted that the direction of the cross-sectional view shown in FIG. 9 is consistent with the direction of the cross-sectional view shown in FIG. 8.

Referring to FIG. 9, after forming the first conductive layer 214 in the second region II, a second dielectric layer 215 may be formed on the first conductive layer 214. The second dielectric layer 215 may also cover the portion of the first dielectric layer 210 formed in the first region I. Corresponding to each first plug structure 211, a second dielectric opening 218 may be formed in the second dielectric layer 215 to expose the top surface of the first plug structure 211, and corresponding to the power conductive layer Vcc, a third dielectric opening 219 may be formed in the second dielectric layer 215 to expose the top surface of the power conductive layer Vcc.

The process of forming the second dielectric layer 215 may include the following exemplary steps. An initial second dielectric layer (not shown) may be formed on the first dielectric layer 210 of the first region I and also on the first conductive layer 214. A second mask layer (not shown) may be formed on the initial second dielectric layer. A plurality of second openings (not shown) and a third opening (not shown) may be formed in the second mask layer to expose a portion of the initial second dielectric layer. The positions of the plurality of second openings may correspond to the locations of the plurality of first plug structures 211, and the position of the third opening may correspond to the location of the power conductive layer Vcc. Further, the second initial dielectric layer may be etched using the second mask layer as an etch mask to expose the top surface of each first plug structure 211 and the top surface of the first conductive layer 214. As such, the second dielectric layer 214 including a plurality of second dielectric openings 218 and a third dielectric opening 219 may be formed. The plurality of second dielectric openings 218 may be located in the first region I, and the third dielectric opening 219 may be located in the second region II.

The second dielectric layer 215 may be made of silicon oxide. Alternatively, the second dielectric layer 215 may be made of a low-K dielectric material (a material having a relative dielectric constant below 3.9) or an ultra-low-K dielectric material (a material having a relative dielectric constant below 2.5).

When the second dielectric layer 215 is made of a low-K dielectric material or an ultra-low-K dielectric material, the material of the second dielectric layer 215 may be SiOH, SiCOH, fluorosilicate glass (FSG), borosilicate glass (BSG), phosphosilicate glass (PSG), borophosphosilicate glass (BPSG), hydrogenated silsesquioxane (HSQ, $(HSiO_{1.5})_n$), or methylsilsesquioxane (MSQ, $(CH_3SiO_{1.5})_n$). In one embodiment, the second dielectric layer 215 may be made of SiCOH.

The initial second dielectric layer may be etched by a dry etching process, a wet etching process, or a process combining dry etching and wet etching. In one embodiment, the initial second dielectric layer may be etched by a dry etching process. The processing gas used in the dry etching process may include an etching gas and a carrier gas. The etching gas may include $CF_4$, $CHF_3$, $CH_2F_2$, $CH_3F$, or a combination thereof, and the carrier gas may be an inert gas. The flow rate of the etching gas may be in a range of approximately 50 sccm to 100 sccm, and the flow rate of the carrier gas may be in a range of approximately 100 sccm to 1000 sccm.

Because the process of forming the word-line conductive layer WL and the power conductive layer Vss is saved in the disclosed method, during the subsequent fabrication process, after forming a second plug structure in each second dielectric opening 218, the second plug structure may be directly in contact with a corresponding first plug structure 211. Therefore, the length of the second plug structure may be increased accordingly. As such, during the fabrication process, the depth of the corresponding second dielectric opening 218 may also need to be increased. However, because the second dielectric opening 218 formed by an etching process is generally in an inverted cone shape, in order to ensure that the bottom of the formed second dielectric opening 218 can expose the top surface of the first plug structure 211, the width at the top of the second dielectric opening 218 may need to be increased accordingly. In one embodiment, the width of the second dielectric opening 218 may be in a range of approximately 10 nm to 100 nm.

Further, returning to FIG. 12, a second plug structure may be formed in each second dielectric opening that is located in the first region, and the bottom surface of the second plug structure may be in contact with the top surface of the corresponding first plug structure; a third plug structure may be formed in the third dielectric opening that is located in the second region, and the bottom surface of the third plug structure may be in contact with the top surface of the first conductive layer (S707). FIG. 10 illustrates a schematic cross-sectional view of a semiconductor structure consistent with various embodiments of the present disclosure.

Referring to FIG. 10, a second plug structure 216 may be formed in the second dielectric layer 215 to fill each second dielectric opening 218 (referring to FIG. 9). The second plug structure 216 may be located in the first region I, and the bottom surface of the second plug structure 216 may be in contact with the top surface of the corresponding first plug structure 211. When forming the second plug structure 216, a third plug structure 217 may be simultaneously formed in the second dielectric layer 215 to fill the third dielectric opening 219 (referring to FIG. 9). The third plug structure 217 may be located in the second region II, and the bottom surface of the third plug structure 217 may be in contact with the top surface of the first conductive layer 214.

The process of forming the second plug structure 216 and the third plug structure 217 may include the following exemplary steps. An initial second plug structure (not shown) may be formed in the second dielectric opening 218 (referring to FIG. 9) and an initial third plug structure (not shown) may be formed in the third dielectric opening 219 (referring to FIG. 9). The initial second plug structure and the initial third plug structure may be planarized until the top surface of the second dielectric layer 215 is exposed. As such, the second plug structure 216 and the third plug structure 217 may be formed. In one embodiment, the initial second plug structure and the initial third plug structure may be planarized by a chemical mechanical polishing (CMP) process.

According to the disclosed method, by directly connecting the first plug structure 211 and the second plug structure 216, the step for forming the word-line conductive layer WL and the power conductive layer Vss may be saved. As such, while satisfying the requirements of the electrical structure, the production efficiency can be effectively improved and the production cost can also be reduced.

The second plug structure 216 may be made of a metal, including ruthenium (Ru), copper (Cu), cobalt (Co), tungsten (W), aluminum (Al), tantalum (Ta), tantalum nitride ($TaN_x$), titanium (Ti), titanium nitride ($TiN_x$), silver (Ag), platinum (Pt), or a combination thereof. In one embodiment, the second plug structure 216 may be made of tungsten (W).

The third plug structure 217 may be made of a metal, including ruthenium (Ru), copper (Cu), cobalt (Co), tungsten (W), aluminum (Al), tantalum (Ta), tantalum nitride ($TaN_x$), titanium (Ti), titanium nitride ($TiN_x$), silver (Ag), platinum (Pt), or a combination thereof. In one embodiment, the third plug structure 217 may be made of tungsten (W).

Further, returning to FIG. 12, after forming the second plug structure and the third plug structure, a second conductive layer may be formed on the second dielectric layer in both the first region and the second region; and the top surface of the second plug structure and the top surface of the third plug structure may be electrically connected to the bottom surface of the second conductive layer, respectively (S708). FIG. 11 illustrates a schematic cross-sectional view of a semiconductor structure consistent with various embodiments of the present disclosure.

Referring to FIG. 11, after forming the second plug structure 216 and the third plug structure 217, a second conductive layer 213 may be formed on the second dielectric layer 215. The second conductive layer 213 may be located in both the first region I and the second region II, and the top surfaces of the second plug structure 216 and the third plug structure 217 may be electrically connected to the bottom surface of the second conductive layer 213, respectively.

The second conductive layer 213 may be made of a metal, including ruthenium (Ru), copper (Cu), cobalt (Co), tungsten (W), aluminum (Al), tantalum (Ta), tantalum nitride (TaN$_x$), titanium (Ti), titanium nitride (TiN$_x$), silver (Ag), platinum (Pt), or a combination thereof. In one embodiment, the second conductive layer 213 may be made of copper (Cu).

Correspondingly, the present disclosure also provides a semiconductor structure formed by a method according to various embodiments of the present disclosure. FIG. 10 illustrates a schematic cross-sectional view of an exemplary semiconductor structure according to various embodiments of the present disclosure.

Referring to FIG. 10, the semiconductor structure may include a substrate 200, including a first region I and a second region II that are adjacent to each other; a first dielectric layer 210, disposed on the substrate 200 in both the first region I and the second region II; and a plurality of first plug structures 211 formed in the first dielectric layer 210. The portion of the first dielectric layer 210 formed in the first region I may expose the top surface of each first plug structure 211. The semiconductor structure also includes a first conductive layer 214, formed on the portion of the first dielectric layer 210 that is located in the first region I; and a second dielectric layer 215. In the first region I, the second dielectric layer 215 may be formed on the first dielectric layer 210, and in the second region II, the second dielectric layer 215 may be formed on the first conductive layer 214. The semiconductor structure may further include a plurality of second plug structures 216 formed in the first region I. Each second plug structure 216 may be formed vertically through the second dielectric layer 215, and the bottom surface of the second plug structure 216 may be in contact with the top surface of the corresponding first plug structure 211.

Compared to existing semiconductor structures and fabrication methods, the disclosed semiconductor structures and fabrication methods may demonstrate the following exemplary advantages.

According to the disclosed methods, in the first region, the bottom surface of the second plug structure is directly in contact with the top surface of the first plug structure. By directly connecting the first plug structure and the second plug structure, the step of forming the word-line conductive layer WL and the power conductive layer Vss is saved. As such, while satisfying the requirements of the electrical structure, the production efficiency can be effectively improved and the production cost can also be reduced.

Further, according to the disclosed fabrication methods and semiconductor structures, the width of the second dielectric opening is in a range of approximately 10 nm to 100 nm. Because the process of forming the word-line conductive layer WL and the power conductive layer Vss is saved in the disclosed method, the second plug structure is formed directly in contact with a corresponding first plug structure. Therefore, the length of the second plug structure needs to be increased accordingly. As such, during the fabrication process, the depth of the corresponding second dielectric opening also needs to be increased. However, because the second dielectric opening formed by an etching process is generally in an inverted cone shape, in order to ensure that the bottom of the formed second dielectric opening can expose the top surface of the first plug structure, the width at the top of the second dielectric opening needs to be increased accordingly.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for forming a semiconductor structure, comprising:
   providing a substrate, including a first region and a second region adjacent to the first region;
   forming a first dielectric layer on the substrate in the first region and the second region;
   forming a plurality of first plug structures in the first dielectric layer, wherein a top surface of each first plug structure of the plurality of first plug structures is exposed by the first dielectric layer;
   forming a first conductive layer on the first dielectric layer of the second region;
   forming a second dielectric layer on the first dielectric layer of the first region and on the first conductive layer of the second region;
   forming a plurality of second plug structures in the second dielectric layer of the first region, wherein a bottom surface of each second plug structure of the plurality of second plug structures is in contact with a top surface of a corresponding first plug structure; and
   forming a gate conductive layer and a plurality of source/drain conductive layers in the first dielectric layer, wherein:
      the plurality of first plug structures is located on the gate conductive layer, the plurality of source/drain conductive layers, or both the gate conductive layer and the plurality of source/drain conductive layers;
   forming a first pull-up gate structure, a first pull-down gate structure, and a first transmission gate structure in the first dielectric layer;
   forming a first source region and a first drain region in the substrate respectively on two sides of the first pull-up gate structure;
   forming a second source region and a second drain region in the substrate respectively on two sides of the first pull-down gate structure; and
   forming a third source region and a third drain region in the substrate respectively on two sides of the first transmission gate structure, wherein:
      the gate conductive layer is located on a top surface of the first transmission gate structure, and the plurality of source/drain conductive layers are respectively located on top surfaces of the first drain region, the second drain region, and the third source region.

2. The method according to claim 1, wherein the first conductive layer includes:
a bit-line conductive layer and a power conductive layer, wherein:
the bit-line conductive layer is electrically connected to the third source region through a first plug structure and a source/drain conductive layer; and
the power conductive layer is electrically connected to the first drain region through a first plug structure and a source/drain conductive layer.

3. The method according to claim 1, wherein forming the first dielectric layer and the plurality of first plug structures includes:
forming an initial first dielectric layer on the substrate in the first region and the second region;
forming a first mask layer on the initial first dielectric layer, wherein a plurality of first openings is formed in the first mask layer to expose portions of the initial first dielectric layer;
etching the initial first dielectric layer using the first mask layer as an etch mask to form the first dielectric layer, wherein a plurality of first dielectric openings is formed in the first dielectric layer; and
forming the plurality of first plug structures in the plurality of first dielectric openings.

4. The method according to claim 1, when forming the plurality of second plug structures, further including:
forming a third plug structure in the second dielectric layer of the second region, wherein:
a bottom surface of the third plug structure is in contact with a top surface of the first conductive layer.

5. The method according to claim 4, wherein forming the second dielectric layer, the plurality of second plug structures, and the third plug structure includes:
forming an initial second dielectric layer on the first dielectric layer of the first region and on the first conductive layer of the second region;
forming a second mask layer, wherein the second mask layer includes a plurality of second openings and a third opening that expose the initial second dielectric layer;
etching the initial second dielectric layer using the second mask layer as an etch mask until exposing top surfaces of the plurality of first plug structures and a top surface of the first conductive layer to form the second dielectric layer, wherein a plurality of second dielectric openings and a third dielectric opening are formed in the second dielectric layer with positions corresponding positions of the plurality of second openings and the third opening, respectively; and
forming the plurality of second plug structures in the plurality of second dielectric openings and forming the third plug structure in the third dielectric opening.

6. The method according to claim 5, wherein:
etching the initial second dielectric layer includes a dry etching process, a wet etching process, or a combination thereof.

7. The method according to claim 5, wherein:
a width of each second dielectric opening of the plurality of second dielectric openings is in a range of approximately 10 nm to 100 nm.

8. The method according to claim 4, after forming the second dielectric layer, further including:
forming a second conductive layer on the second dielectric layer, wherein:
the second conductive layer is located in the first region and the second region; and
a top surface of the plurality of second plug structures and a top surface of the third plug structure are electrically connected to a bottom surface of the second conductive layer, respectively.

9. The method according to claim 1, wherein:
the substrate is made of silicon (Si), germanium (Ge), silicon germanium (SiGe), silicon carbide (SiC), gallium arsenic (GaAs), or indium arsenic (InAs).

10. The method according to claim 1, wherein:
the plurality of source/drain conductive layers and the gate conductive layer are made of a metal, including copper (Cu), cobalt (Co), tungsten (W), aluminum (Al), titanium (Ti), titanium nitride ($TiN_x$), tantalum (Ta), tantalum nitride ($TaN_x$), ruthenium (Ru), or a combination thereof.

11. The method according to claim 1, wherein:
the plurality of first plug structures is made of a metal, including copper (Cu), cobalt (Co), tungsten (W), aluminum (Al), titanium (Ti), titanium nitride ($TiN_x$), tantalum (Ta), tantalum nitride ($TaN_x$), ruthenium (Ru), or a combination thereof.

12. The method according to claim 1, wherein:
the first dielectric layer is made of a material including silicon oxide ($SiO_x$), a low-K dielectric material, an ultra-low-K dielectric material, or a combination thereof.

13. The method according to claim 1, wherein:
the second dielectric layer is made of a material including silicon oxide ($SiO_x$), a low-K dielectric material, an ultra-low-K dielectric material, or a combination thereof.

14. The method according to claim 1, wherein:
the plurality of second plug structures is made of a metal, including ruthenium (Ru), copper (Cu), cobalt (Co), tungsten (W), aluminum (Al), tantalum (Ta), tantalum nitride ($TaN_x$), titanium (Ti), titanium nitride ($TiN_x$), silver (Ag), platinum (Pt), or a combination thereof.

15. The method according to claim 1, wherein:
the third plug structure is made of a metal, including ruthenium (Ru), copper (Cu), cobalt (Co), tungsten (W), aluminum (Al), tantalum (Ta), tantalum nitride ($TaN_x$), titanium (Ti), titanium nitride ($TiN_x$), silver (Ag), platinum (Pt), or a combination thereof.

16. A semiconductor structure, comprising:
a substrate, including a first region and a second region adjacent to the first region;
a first dielectric layer, formed on the substrate in the first region and the second region;
a plurality of first plug structures, formed in the first dielectric layer, wherein a top surface of each first plug structure of the plurality of first plug structures is exposed by the first dielectric layer;
a first conductive layer, formed on the first dielectric layer of the second region;
a second dielectric layer, formed on the first dielectric layer of the first region and on the first conductive layer of second region;
a plurality of second plug structures, formed in the second dielectric layer of the first region, wherein a bottom surface of each second plug structure of the plurality of second plug structures is in contact with a top surface of a first plug structure;

a gate conductive layer and a plurality of source/drain conductive layers, formed in the first dielectric layer, wherein the plurality of first plug structures is located on the gate conductive layer, the plurality of source/drain conductive layers, or both the gate conductive layer and the plurality of source/drain conductive layers;

a first pull-up gate structure, a first pull-down gate structure, and a first transmission gate structure in the first dielectric layer;

a first source region and a first drain region in the substrate respectively on two sides of the first pull-up gate structure;

a second source region and a second drain region in the substrate respectively on two sides of the first pull-down gate structure; and a third source region and a third drain region in the substrate respectively on two sides of the first transmission gate structure, wherein:

the gate conductive layer is located on a top surface of the first transmission gate structure, and the plurality of source/drain conductive layers are respectively located on top surfaces of the first drain region, the second drain region, and the third source region.

17. The semiconductor structure according to claim 16, further including:

a third plug structure, formed in the second dielectric layer of the second region, wherein:

a bottom surface of the third plug structure is in contact with a top surface of the first conductive layer.

* * * * *